BLANKING CIRCUIT FOR RING COUNTER AND INCLUDING GATING CIRCUITS AT THE OUTPUTS THEREOF

Filed June 20, 1962 3 Sheets-Sheet 1

INVENTOR.
LOUIS A. de BOTTARI
CIRO GUAJARDO
BY
Christie, Parker & Hale
ATTORNEYS.

INVENTOR.
LOUIS A. de BOTTARI
CIRO GUAJARDO
BY Christie, Parker & Hale
ATTORNEYS.

3,165,646

BLANKING CIRCUIT FOR RING COUNTER AND INCLUDING GATING CIRCUITS AT THE OUTPUTS THEREOF

Louis A. de Bottari and Ciro Guajardo, Torrance, Calif., assignors to Alpha-Tronics Corporation, Torrance, Calif., a corporation of California Filed June 20, 1962, Ser. No. 203,839
6 Claims. (Cl. 307—88.5)

This invention relates to electronic circuits and more particularly to electronic gating circuits.

Timing generators are commonly used for sequencing the operation of test apparatus and the like. Many times it is desirable for the timing generator to develop a single output pulse for each operative step of a test apparatus and further to develop the output pulse in synchronism with, for example, clock pulses. Counters with connected diode gating circuits for gating out the output signals of the counter in synchronism with timing pulses have been used for timing generators.

Generally, there are a number of disadvantages with diode gating circuits for gating the output signals of counters. In one type of counter employing a diode gating circuit, if one of the output circuits of the diode gating circuit is shorted to ground potential the counter may be stopped entirely or a state of the counter may be skipped. Also, a diode gating circuit normally has a loading resistor connected to a power supply. Thus, if a diode gate is provided for each output circuit of a counter and each diode gate has a loading resistor, power is drawn by each loading resistor all of the time, even though part of the time the gating circuits are not gating out the output signals of the counter.

In contrast to the prior art diode gating circuits for counters the present invention provides a gating circuit wherein a short circuit applied at an output circuit thereof does not affect the operation of the counter. Also, a short circuit applied at one of the output circuits does not affect the output signal at the other output circuits of the counter. Further, individual switching circuits are provided for each output circuit of the counter and only the ones which are gating out counter signals draw appreciable power. In addition, none of the switching circuits draw power except when output signals of the counter are to be gated out. Another advantage of a counter employing the present invention is that two or more stages may be cascaded together without obtaining overlapping or erroneous signals during switching operations of the cascaded stages. By providing the proper input connections for a counter according to the present invention, an output signal will be developed only during a counting pulse applied to the counter. Also, the output signal of a counter according to the present invention, connected for developing an output signal during a counting pulse, is delayed for a fixed time interval so that the counter will reliably change state and settle its operations before the output signal of the counter is gated out. Further, the number of components required for a gating circuit according to the present invention is greatly reduced over that of the above prior art timing generator.

Briefly, a specific embodiment of the present invention comprises: a counting circuit for providing a synchronized output signal including a counter having a plurality of output circuits. A separate switching circuit having control and power circuits is provided for each output circuit of the counter. Each switching circuit is arranged with the control circuit thereof connected to the corresponding output circuit of the counter. A circuit is provided for applying electrical power in common to the power circuits of the switching circuits in response to synchronizing signals.

These and other aspects of the present invention may be more fully understood with reference to the following description of the figures of which:

Figure 1:
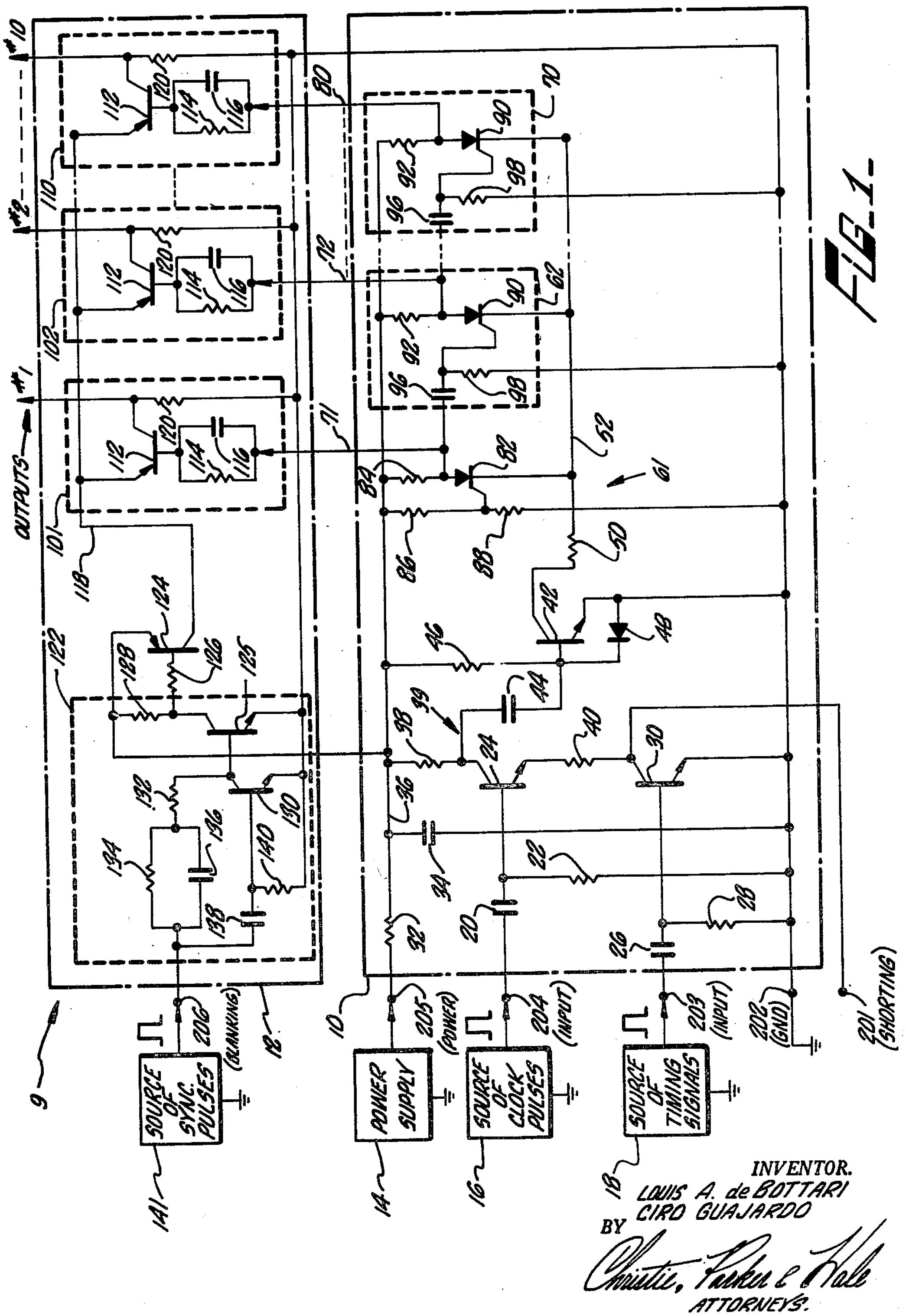
FIG. 1 is a schematic diagram of a sequencer circuit, and embodying the present invention.

FIG. 1 shows a schematic diagram of a sequencer 9 including a counting circuit 10 and a blanking circuit 12 and embodies the present invention. The counting circuit 10 is a means for providing timing signals to the blanking circuit 12, and is a ring type counter using silicon controlled rectifier elements. The counting circuit 10 is the subject of a copending application entitled Counter, assigned to the same assignee as this application and bearing the Serial No. 203,980 and filed on June 20, 1962 which is hereby incorporated by reference.

Briefly, the counting circuit 10 receives power from a power supply 14. The counting circuit 10 is a ring type of counter and has ten states of operation. The counter 10 is responsive to a positive voltage pulse from a source of clock pulses 16 in coincidence with a positive voltage pulse from the source of timing signals 18 for counting from one state of operation to the next. The output circuit of the source of clock pulses 16 is coupled through a differentiating circuit including a capacitor 20 and a resistor 22 to the base electrode of an NPN transistor 24. The output circuit of the source of timing signals 18 is coupled through another differentiating circuit including a capacitor 26 and a resistor 28 to the base electrode of an NPN transistor 30. The output circuit of the power supply 14 is connected to ground (0 volts potential) through a filter circuit including a resistor 32 and a capacitor 34. The output of the filter circuit is connected to a power supply line 36. The resistor 38, the transistor 24, a resistor 40 and the transistor 30 are connected in series between the power supply line 36 and ground to form an "and" type gating circuit 39 for the input pulses. The collector electrode of the transistor 24 is coupled to the base electrode of a series switching NPN transistor 42 by means of a coupling capacitor 44. The transistor 42 has its base and emitter electrodes connected through a biasing resistor 46 to the power supply line 36 and ground potential, respectively. A silicon diode 48, which is a reverse bias limiting diode, is connected between the emitter and base electrodes of the transistor 42. The collector electrode of the transistor 42 is connected to a common load line 52 through the series connection of a common load resistor 50.

Ten bistable circuits are connected between the common load line 52 and the power supply line 36. The ten bistable circuits or counting stages are referenced by the numbers 61 through 70. The stages 62 through 70 are identical whereas stage 61 has a special start circuit which is described in detail in the above referenced co-pending patent application entitled Counter. The stage 61 includes a PNPN type semiconductor element referred to as a silicon controlled rectifier (SCR) element 82 and a resistor 84. The resistor 84 and the SCR element 82 are connected in series between the power supply line 36 and the common load line 52. A voltage divider circuit including resistors 86 and 88 are connected in series between the power supply line 36 and ground. The junction between the voltage divider resistors 86 and 88 is connected to the control electrode of the SCR element 82.

The stage 62 comprises a load resistor 92 and an SCR element 90 connected in series between the power supply line 36 and the common load line 52. The control electrode of the SCR element 90 of stage 62 is connected to the junction between a capacitor 96 and a resistor 98 of a differentiating circuit. The other side of the capacitor 96 and the resistor 98 from the control electrode of the SCR element 90 of stage 62 are connected to the anode electrode of the diode 82 and ground, respectively. The stages 62 through 70 inclusive, are identical to the stage 62, only stage 70 being shown, and elements therein are referenced by the same numbers. The output circuits of each of the stages 61 through 70 are taken at the anode electrode of the SCR element of the stage and are connected to ten output lines 71 through 80, respectively.

Briefly, when the power supply 14 is turned on the voltage divider including resistors 86 and 88 and the common load resistor 52 bias the SCR element 82 of the first stage 61 into a conductive condition.

A positive input pulse from the source of clock pulses 16 in coincidence with a positive input pulse from the source of timing signals 18 are coupled through the differentiating circuits to the transistor "and" gating circuit 39 which cause the series transistor switch 42 to disconnect common load resistor 50 from ground. When the common load resistor 50 is disconnected from ground the SCR element 82 is switched into a non-conductive condition. After the capacitors 20 and 26 charge, the transistor "and" gating circuit 39 causes the series transistor 42 to re-connect the common load resistor 50 to ground and the capacitor 96 biases the SCR element 90 of the second stage 62 into a conductive condition. When a stage of 61 through 70 is in a conductive condition, the corresponding output line of 71 through 80 is at a low potential level essentially equal to ground. When a stage is in a non-conductive condition the corresponding output line is at a high potential level essentially equal to that at the power supply line 36. The operation for subsequent pulses applied simultaneously by sources 16 and 18 is similar but causes the conductive condition of the stages to be shifted to the SCR elements of subsequent stages of the counter 10. When the SCR element of stage 70 is switched into a non-conductive condition the SCR element 82 of the first stage 61 is switched into conduction as described hereinabove when the power supply 14 is switched on.

Refer now to the blanking circuit 12. The output lines 71 through 80, inclusive, of the counter 10 are connected to ten switching means or circuits referenced by the numbers 101 through 110, inclusive. The switching circuit 101 includes a PNP transistor element 112. A current limiting resistor 114 and a speed-up capacitor 116 are connected in parallel circuit relation and are connected in series between the base electrode of the transistor 112 of switching circuit 101 and the output line 71 of the counter 10. The emitter electrode of the transistor 112 is connected to a common emitter line 118 and the collector electrode is connected in series to ground by means of a load resistor 120.

The stages 102 through 110 are identical to the switching circuit 101 and have the corresponding elements referenced by the same numbers as the switching circuit 101. Similar to the switching circuit 101, the switching circuits 102 through 110 have the common junction of the current limiting resistor 114 and the capacitor 116 opposite from the base electrode of the transistors 112 connected to the output line 72 through 80, respectively. Also, similar to the switching circuit 101, the switching circuits 102 through 110 have the emitter electrode of the transistors 112 connected in common to the common emitter line 118.

Output circuits of the switching circuits 101 through 110 are taken at the collector electrodes of the transistors 112 and are referenced by the reference symbols #1 through #10. Control circuits of the switching circuits 101 through 110 are taken at the junction formed by the lines 71 through 80 and elements 114 and 116. The emitter electrodes of the transistors 112 are the input or power circuits of the switches 101 through 110.

Also included in the blanking circuit 12 is a delay circuit 122 and a series switching means. The series switching means includes a PNP transistor 124 and a current limiting resistor 126. The collector and emitter electrodes of the transistor 124 are connected to the common emitter line 118 and the power supply line 36. The base electrode of the transistor 124 is connected in series to the output circuit of the delay circuit 122 by means of the current limiting resistor 126. The series switching means or circuit has an input circuit at the emitter electrode of the transistor 124. The series switching means has a power or output circuit at the collector electrode of the transistor 124. A control circuit of the series switching means is provided at the end of the resistor 126 which is connected to the delay circuit 122.

The delay circuit 122 includes a switching means including an NPN transistor 125, a load resistor 128, resistors 132 and 134 and a capacitor 136. Also included in the delay circuit 122 is another switching means including an NPN transistor 130 and a differentating circuit including a capacitor 138 and a resistor 140. The transistor 125 has its collector electrode connected to the power supply line 36 by means of the load resistor 128 and its emitter electrode connected to ground. The base electrode of the transistor 125 is connected to the collector electrode of the transistor 130. The collector electrode of the transistor 130 is connected to the output circuit of a source of synchronizing pulses 141 through the series connection of the resistors 132 and 134. The capacitor 136 is connected in parallel with the resistor 134. The base electrode of the transistor 130 is also connected to the output circuit of the source of synchronizing pulses 141 by means of a series connection of the capacitor 138. The base electrode of the transistor 130 is also connected to ground through the resistor 140. The switching means including the transistor 125 has its power or output circuit at the collector electrode of the transistor 125 which is also the power or output circuit of the delay circuit 122. The control circuit of the switching means including the transistor 125 is that connected to the source 141. Similarly, the switching means including the transistor 130 has output and control circuits at the collector electrode of the transistor 130 and the side of capacitor 138 which is connected to the source 141.

With the details of the blanking circuit 12 in mind, refer to its operation. Assume that the source of synchronizing pulses 141 develops a 0 volt output signal, and that the power supply 14 is developing a positive voltage output signal causing a positive potential at the power supply line 36. The resistors 134 and 132 bias the base electrode of the transistor 124 to ground potential causing it to be in a non-conductive condition. Similarly, the resistor 140 biases the transistor 130 into a non-conductive condition. The resistors 126 and 128 bias the base electrode of the transistor 124 to a potential substantially equal to that at the power supply line 36. Since the emitter electrode of the transistor 124 is connected to the power supply line 36, the transistor 124 is also biased into a non-conductive condition. With the transistor 124 in a non-conductive condition, a high impedance essentially equivalent to an open circuit is provided between the power supply line 36 and the common emitter line 118. Therefore, the common emitter line 118 is connected to an open circuit or power is switched off by the transistor 124. Therefore, the output signal at the output circuits #1 through #10 are biased at 0 volts potential by the load resistors 120 of each switching circuit regardless of the signal developed at the output lines 71 through 80 of the counter 10.

Assume now that the source of synchronizing pulses 141 develops a positive voltage output pulse. The capacitor 136 is a speed-up capacitor and initially shorts the positive output pulse from the source of synchronizing pulses 141 to the resistor 132 which in turn applies the positive signal to the base electrode of the transistor 124 tending to switch it into a conductive condition. However, the capacitor 138 and the resistor 140 are proportioned so that the capacitor 138 initially acts like a short circuit coupling the positive output pulse from the source of synchronizing pulses 141 to the base electrode of the transistor 130 and thereby switches it into a conductive condition. The conductive transistor 130 in turn shorts the base electrode of the transistor 125 to ground causing it to remain in a non-conductive condition, even though a positive signal is applied to the resistor 132 by the capacitor 136.

The impedance values of the capacitor 138 and the resistor 140 are proportioned so that the capacitor 138 charges sufficiently that the potential applied at the base electrode of the transistor 130 switches it into a non-conductive condition before the termination of the pulse from source 141. When the transistor 130 is switched into a non-conductive condition, the base electrode of the transistor 125 rises due to the positive potential applied through the resistor 132 and the parallel combination of the resistor 134 and the capacitor 136. The impedance values of the capacitor 136, the resistor 134 and other connected impedances are such that the capacitor 136 also charges before the termination of the pulse developed by the source 141. After the capacitor 136 charges the transistor 125 is held in conduction through the resistors 134 and 132 by the positive output pulse of the source 141.

After the potential at the base electrode of the transistor 125 rises sufficiently to bias it into a conductive condition, the collector electrode thereof drops to essentially ground potential. This causes current to flow through resistor 128 which in turn biases the transistor 124 into conduction. This causes current to flow through the emitter to base electrodes of the transistor 124 and the resistor 126 to the collector electrode of the transistor 125. When the transistor 124 is bised into a conductive condition a very low impedance or essentially a short circuit is connected between the common line 118 and the power supply line 36. Therefore, power of a positive potential is switched to the common emitter line 118 and to the emitter electrodes of each of the transistors 112 in the switching circuits 101 through 110.

The operation of the counter 10 is such that a positive pulse applied to the delay circuit 122 simultaneously with pulses from both source 16 and 18 will cause the counter 10 to reliably change stages, switching a stage into non-conduction and the next stage into conduction prior to the time the common emitter line 118 is coupled to the power supply line 36.

Assume that before the common emitter line 118 is coupled to the power supply line 36, the signal at the output line 71 drops to ground. The relative impedance values of the speed-up capacitor 116 and other connected impedances cause the capacitor 116 to initially short the drop in potential at the output line 71 directly to the base electrode of the transistor 112 of the switching circuit 101. After the speed-up capacitor 116 begins to charge current starts flowing through the current limiting resistor 114 from the base electrode of the transistor 112 to the output line 71. When the power supply line 36 is coupled to the common emitter line 118, a positive potential is applied at the emitter electrode with respect to the base electrode of the transistor 112 of switching circuit 110 causing it to be switched into a conductive condition. When the transistor 112 of the switching circuit 101 is in a conductive condition, the output line #1 is coupled to the common emitter line 118 and the potential at the power supply line 36 is applied at the output circuit #1. The operations of the switching circuits 102 through 110 are identical to that of the switching circuit 101. Thus, a high potential output signal at the output lines #1 through #10 indicates a low potential signal at the output of the corresponding stage of the counter 10 and represent the state of the counter 10.

As indicated, the counter 10 of the sequencer 9 has ten different states of operation. If more than ten states of operation are desired, either more counter stages may be added or two or more sequencer stages 9 may be con nected together in cascade. It is desirable to have one standard sequencer package which does not require modification for adding more states of operation, therefore, two or more sequencer stages 9 are connected in cascade to obtain more states of operation.

Figure 2:
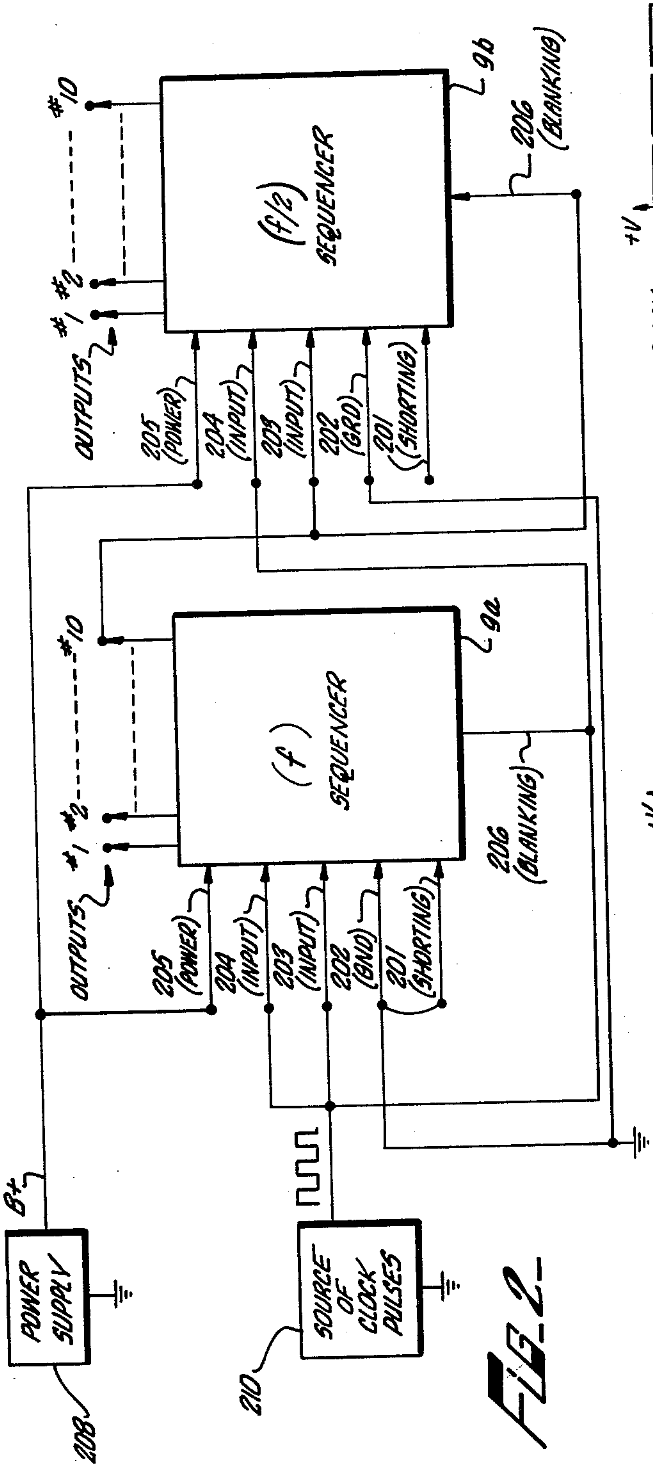
FIG. 2 is a block diagram illustrating the inter-connection of two of the sequencer circuits shown in FIG. 1 when connected in cascade and embodying the present invention.

FIG. 2 shows an example of how sequencer stages 9 may be connected in cascade. Only the input lines to the sequencer 9 are shown in FIG. 2 rather than the details of the circuit, in order to provide a simple block diagram for purposes of illustration. Referring to the input lines and their connections as shown in FIG. 1, the collector electrode of the transistor 30 is connected to an input shorting line 201. The ground line is connected to an input line 202. The capacitors 26 and 29 are connected to input lines 203 and 204, respectively. The input side of the filtering resistor 32 is connected to a power line 205. The junction of the capacitor 138, the capacitor 136 and resistor 134 is connected to a blanking line 206.

Refer now to FIG. 2. Two sequencer stages are shown, *9a* and *9b*. The stages *9a* and *9b* are identical except for their input connections. Referring to the input connections of the sequencer stage *9a*, the power line 205 is connected to the output circuit of a positive voltage power supply 208. The input line 204 and the blanking line 206 are connected to the output circuit of a source of clock pulses 210. The shorting line 201 and the ground line 202 are connected to ground. The input line 203 is not connected to anything but is left open.

The second sequencer *9b* of the cascade has its power line 205 connected to the output circuit of the power supply 208. The input line 204 is connected to the output circuit of the source of clock pulses 210. The blanking line 206 and the input line 203 are connected to the output #10 of the sequencer *9a*. The ground line 202 is connected to ground and the shorting line 201 is not connected to anything but is left open.

Figure 3:
FIG. 3 is a wave-shaped diagram illustrating the general wave shapes of signals at designated points in the cascaded sequencer circuits of FIG. 2.

FIG. 3 shows a diagram illustrating the wave shapes at designated output circuits of the sequencer circuits *9a* and *9b* corresponding to clock pulses. Assume initially that the power supply 208 is turned on and a positive output potential is applied to the power lines 205 of the sequencer circuits *9a* and *9b*. As discussed in connection with the counter 10 of FIG. 1, the first stage of the counters 10 of the sequencers *9a* and *9b* are initially switched into a conductive condition. Also, assume that initially the output signal of the source of clock pulses 210 is at ground potential. The blanking line 206 of sequencer stage *9a* is then at ground potential causing the output lines #1 through #10 of the sequencers *9a* to be at ground potential. Since the output line #10 of the sequencer *9a* is at ground potential level, the signal at the input line 204 and the blanking line 206 of the sequencer stage *9b* are also at ground potential. As a result, each of the output lines #1 through #10 of the sequencer *9b* are also at ground potential.

Assume now that the source of clock pulses 210 develops a positive output pulse. The positive clock pulse is applied both at the input line 204 and the blanking line 206 of the sequencer *9a* and the input line 204 of the sequencer *9b*. Thus, the sequencer *9a* is counted from state one into state two wherein the stage corresponding to the output line #2 is in a conductive condition. However, the clock pulse has no effect on the sequencer 9b because ground potential is applied to the input line 204 thereof by the #10 output circuit of sequencer 9a and the output signal of the "and" gate 39 (see FIG. 1) is not changed by the clock pulse. Thus, the sequencer 9b remains in state one. The control circuit 122 of the sequencer 9a is energized by the positive clock pulse applied to the blanking line 206. Subsequently, after the time delay of the delay circuit 122 of the sequencer 9a (see FIG. 1) the power supply line 36 is coupled to the common emitter line 118 causing a high potential signal to be applied to each of the switching circuits of the sequencer 9a and a high potential signal is applied on the output line #2 indicating the state of the counter 10 of the sequencer 9a. Subsequently, the output signal of the source of clock pulses 210 drops back to ground potential, the common emitter line 118 (see FIG. 1) of the sequencer 9a is disconnected from the power supply line 36 and the potential at the output line #2 of the sequencer 9a drops back to a ground potential.

The next clock pulse is applied to the sequencer 9a in the same manner, causing it to count from state two to state three, wherein the output line #3 (not shown) receives a high potential output signal. As described for state two, the sequencer 9b again remains in state one.

Assume now that the sequencer 9a is in state nine and that the sequencer 9b is in state one. Also assume that the source of clock pulses 210 develops a positive clock pulse. The clock pulse from the source 210 is applied to the input 204 and the blanking line 206 of the sequencer 9a and the input 204 of the sequencer 9b. As indicated in FIG. 3, when the clock pulse occurs the output signal at line #10 of the sequencer 9a, therefore, input line 203 of sequencer 9b are at ground potential. Since the input line 203 of sequencer 9b is at ground potential initially, the clock pulse from the source 210 does not have any affect thereon. However, the clock pulse applied at the input line 204 of the sequencer 9a causes it to count from state nine to state ten. After the delay of the control circuit 122 of the sequencer 9a (see FIG. 1), a high potential output signal is developed at the output line #10 of the sequencer 9a. The high potential signal at the output circuit of the sequencer 9a causes a high potential signal to be applied at the input circuit 203 and the blanking line 206 of the sequencer 9b. The clock pulse is still present when the high potential signal is applied at the input line 203. Therefore, the clock pulse on the input line of the sequencer 9b causes it to count from state one into state two. After the time delay of the delay circuit 122 of sequencer 9b (see FIG. 1) the high potential signal is applied at the output line #2 of the sequencer 9b.

Thus, it should now be understood that a signal will be developed at one of the output lines #1 through #10 of the sequencer 9b only once during the ten states of the sequencer 9a. Also, with a blanking circuit according to the present invention, neither the sequencer 9a nor the sequencer 9b will develop ambiguous output signals since no output signal is developed until the counters have reliably changed states. Thus, the blanking circuit 12 of the sequencers 9a and 9b insures that whenever power is applied to the common emitter line 118 thereof, the counter 10 has reliably counted into its next state of operation so that the output signal at the output circuits #1 through #10 will be a true representation of the state of the counter.

It will also be noted that with the inter-connection indicated in FIG. 2, that sequencers 9a and 9b develop output signals only in coincidence with clock pulses. Thus, the output signals from the sequencers 9a and 9b are representations of the states of the counters 10 thereof and are developed in synchronism with clock pulses. Thus, if a clock pulse has a 50% duty cycle, the output signal of the sequencers, neglecting the delay of the control circuit 122, also has a 50% duty cycle.

It should also be understood that the blanking line 206 of the counter 9a may be connected to the output of the power supply 208. In such an arrangement, the sequencer 9a will develop a continuous output signal indicative of the state of the counter 10 after the counter 10 has changed states. Also, instead of connecting the shorting line 201 of sequencer 9a to ground, the shorting line 201 may be left open and the input line 203 thereof may be connected to another source of control pulses as explained in connection with FIG. 1. These and many other re-arrangements of the present invention may be devised without departing from the scope of the present invention.

Figure 4:
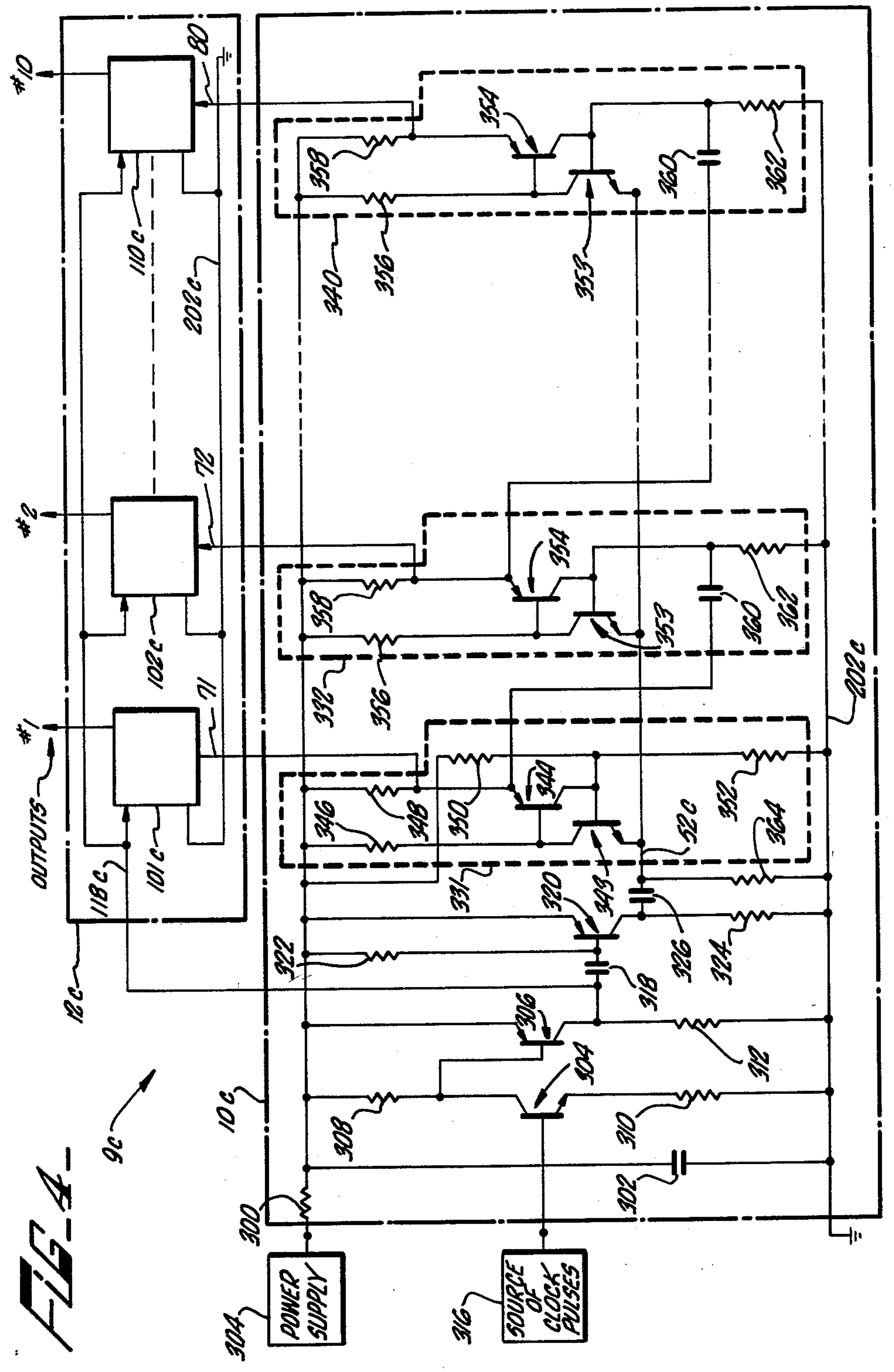
FIG. 4 is a schematic diagram of a sequencer circuit employing an alternate counter and gating arrangement and embodying the present invention.

Refer now to the alternate sequencer circuit shown in schematic diagram of FIG. 4. The counter 10c of the sequencer 9c shown in FIG. 4 has a filter circuit including a resistor 300 and a capacitor 302 connected to the output of a power supply 304 identical to that of FIG. 1. An amplifying circuit including an NPN transistor 304, a PNP transistor 306, resistors 308, 310 and 312 are connected to the output of a source of clock pulses 316. The output of the transistor amplifier is at the collector electrode of the transistor 306 and is connected through a differentiating capacitor 318 to the input circuit of an amplifier circuit including a PNP transistor 320, resistors 322 and 324. The output circuit of the transistor amplifier including the transistor 320 is at the collector electrode of the transistor 320 and is coupled through a differentiating and D.C. isolation capacitor 326 to a common line 52c. The common line 52c is connected in common to the power circuit of ten bistable switching circuits 331 through 340.

The bistable switching circuits 331 through 340 are similar to the stages 61 through 70 of the sequencer 9 shown in the schematic diagram of FIG. 1. However, in place of the SCR elements of the stages 61 through 70 of FIG. 1, the bistable switching circuits 331 through 340 are provided with a pair of complementary connected transistors. Stage 331 corresponds to stage 61 of FIG. 1 and includes an NPN transistor 343, a PNP transistor 344 and load resistors 346 and 348. Similar to the stage 61 of FIG. 1, stage 331 of FIG. 4 has a voltage divider circuit including resistors 350 and 352, connected to the base electrode of the transistor 343. The stage 332 also has a pair of complementary connected transistors 353 and 354 identical to the transistors 343 and 344. Similar to the load resistors 346 and 348, stage 332 has load resistors 356 and 358. In place of the voltage divider resistors 350 and 352 of stage 331, stage 332 has a capacitor storage circuit including a capacitor 360 and a resistor 362 for transferring the conductive state of one stage to the next. The stages 332 through 340 are identical to the stage 332 and have correspondingly numbered elements. A common load resistor 364 is connected in series between the common line 52c and the ground line 202c.

The output circuits of the stages 331 through 340 are at the collector electrodes of the PNP transistors thereof and are connected to a blanking circuit 12c having gating circuits 101c through 110c, which are identical to the switching circuits 101 through 110 of FIG. 1. The common emitter line 118c of FIG. 4 corresponds to the common emitter line 118 of FIG. 1 and is connected to the collector electrode of the transistor 306.

Other details of the counter circuit 10c of FIG. 4 are given in the above-referenced copending patent application. However, it should be noted that the control circuit of FIG. 1 employing a delay to insure complete and reliable switching of the counter before an output signal is developed may be eliminated and the common emitter line 118c connected as shown in FIG. 4 due to the faster switching operation possible by the complementary transistor arrangement of stages 331 through 340 as compared with the slower switching action of available SCR elements.

Figure 5:
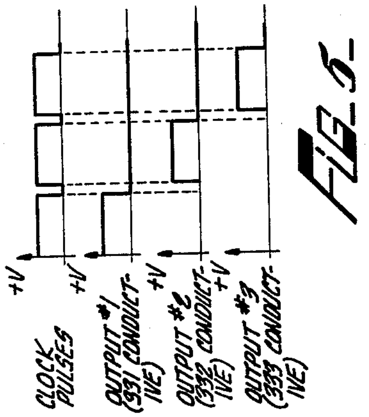
FIG. 5 is a wave-shape diagram illustrating the relation of the output signals of the gating circuit to the clock pulse signals applied to the sequencer of FIG. 4.

FIG. 5 is a wave shape diagram illustrating the operation of the sequencer 9c of FIG. 4. As indicated in FIG. 5, a pulse pair is required to trigger the counter from one state of operation to the next and develop a synchronized output signal. The pulse pairs include a dropping potential pulse signal and a rising potential pulse signal which vary between a positive potential and ground potential. The dropping potential pulse signal causes the conductive stage of 331 through 340 to be switched into a non-conductive condition and the next succeeding stage to be switched into a conductive condition. The following rising potential pulse signal applies power to the common emitter line 118c causing the switching circuits 101c through 110c to couple the coded output signals of the counter 10c to the output circuits reference by the symbols #1 through #10.

Assume initially that stage 331 is in a conductive condition and the source of clock pulses 316 develops a high positive potential output pulse. The amplifier including the transistors 304 and 306 amplify the signal and apply a high positive potential signal to the plate of the differentiating capacitor 318. Assume that the capacitor 318 has charged to a steady state condition, the resistor 322 then biases the transistor 320 into a non-conductive condition and a low potential signal of approximately 0 volts is applied to the differentiating and coupling capacitor 326. The junction of the capacitor 326 and the common load resistor 364 is at a high potential level due to the conductive condition of stage 331.

Subsequently, the output signal of the source of clock pulses 316 drops to ground potential, thereby, generating a negative changing output pulse. The amplifier including the transistors 304 and 306 applies an amplified signal similar to that out of the source 316 to the capacitor 318. The capacitor 318 differentiates the signal and applies a narrow dropping in potential signal to the base electrode of the transistor 320. The transistor 320 is switched into a conductive condition by the signal causing a rise in potential at the collector electrode thereof. The capacitor 326 differentiates the positive pulse signal applied at the collector electrode of the transistor 320 and the resulting signal is applied to the common line 52c, thereby, switching the complementary transistor pair of stage 331 into a non-conductive condition. Subsequently, the output signal of the source of clock pulses 316 rises back to a high potential level causing a high potential level signal to be applied on the common emitter line 118c and power is applied to the emitter circuits of each of the transistor switching circuits 101c through 110c, thereby, causing the coded output signals of the counter 10c to be coupled to the output circuit of the blanking circuit 12c, as described hereinabove in connection with FIG. 1.

What is claimed is:

1. A counter having a controllable output circuit the combination of which comprises, a source of timing pulses, means connected for counting the pulses from said timing pulse source and including a plurality of output circuits for developing a corresponding output signal, switching means for each output circuit including input, output, and control circuits and characterized as normally being arranged in a high impedance condition between the input and output circuits thereof and connected to be responsive to a signal applied at the control circuit thereof by the corresponding output circuit of said timing pulse source for switching into a low impedance condition between said input and output circuits, means for developing a preselected electrical signal, second switching means having a control circuit, an output circuit coupled in common to the input circuits of each of said first switching means and an input circuit coupled to the preselected signal means, said second switching means being normally arranged in a high impedance condition across the input and output circuits thereof and responsive to a signal applied at the control circuit thereof for switching into a low impedance condition and thereby applying said preselected signal to the input circuits of said first switching means, a source of synchronizing signals, and a delay circuit connected to be responsive to the signals from said synchronizing signal source for applying a signal to the control circuit of said second switching means.

2. A counting circuit for providing output signals in synchronism to timing signals the combination of which comprises a counting circuit having a plurality of output circuits and connected to be responsive to an applied pulse for counting same and for providing a corresponding signal at the output circuits thereof, a transistor switching circuit for each output circuit of said counting circuit each including a control circuit coupled to the corresponding output circuit of said counting circuit, an input circuit and an output circuit, a switching circuit having an output circuit coupled in series with the input circuit of each of said transistor switching circuits and a control circuit and arranged to be responsive to a signal applied at the control circuit thereof for applying an electrical signal in common at the input circuits of each of said transistor switching circuits, said transistor switching circuits further being connected to be responsive to the signal applied at the input circuit thereof for providing an output indication of a signal applied at the control circuit thereof, and means connected for applying a signal at the input circuit of said switching circuit.

3. A controllable gating circuit for a counter the combination of which comprises a plurality of first transistor switching circuits each comprising a control circuit for receiving signals to be controllably gated out, an input circuit and an output circuit, said first transistor switching circuits being normally biased into a non-conductive condition between the input and output circuits thereof, and responsive to a signal at the control circuit thereof for switching into a conductive condition therebetween, a second transistor switching circuit having a power circuit coupled in common with the input circuits of said first transistor switching circuits and a control circuit, said second transistor switching circuit being normally biased into a non-conductive condition at the power circuit thereof and responsive to a signal at the control circuit thereof for switching into a conductive condition for applying an electrical signal in common to said first transistor switching circuits, a third transistor switching circuit including a control circuit and connected to be responsive to a signal applied at the control circuit thereof for applying a signal to the control circuit of said second transistor switching circuit, means connected to be responsive to an applied input signal for applying an electrical signal at the control circuit of said third transistor switching circuit, a fourth transistor switching circuit connected to be responsive to an applied input signal for removing the signal applied at the control circuit of said third transistor switching circuit by the last mentioned means, and a differentiating circuit connected for applying a signal at the control circuit of said fourth transistor switching circuit in response to an applied input signal.

4. A counting circuit for providing a synchronized output signal, the combination of which comprises a source of pulses, a counting circuit having a plurality of output circuits and connected for counting the source pulses and for developing a signal at the output circuits thereof, first individual switching means for each output circuit of said counting circuit having input, output, and control circuits, said first switching means being connected to be responsive to a signal applied at the control circuit thereof for coupling the input circuit to the output circuit thereof for providing an indication of the signal at the control circuit, means connected to be responsive to the signals at the output circuits of said counting circuit for individually applying same to the control circuit of the corresponding first switching means, a second switching means having a control circuit and a separate output circuit connected in common with the input circuits of said first switching means, said second switching means being connected to be responsive to a signal applied at the control circuit thereof for applying an electrical signal in common at the input circuits of the first switching means, means for providing an output pulse each time an indication of the output signal of said counting circuit is desired, and a delay circuit connected to be responsive to an output pulse from the last mentioned means for applying a delayed signal at the control circuit of said second switching means.

5. A counting circuit for providing a synchronized output signal, the combination of which comprises a source of pulse pairs said pulse pairs being of oppositely changing potential about a voltage level, a plurality of switching circuits connected in cascade including first and last switching circuits, each of said switching circuits including output and control circuits and characterized as being responsive to signals applied between the control and output circuit thereof for switching into first and second conductive states, each of said switching circuits except one normally being switched into the first state thereof, separate storage means connected to be individually responsive to a change from the second to the first state of each switching circuit other than said last switching circuit for applying a signal to the control circuit of the succeeding switching circuit in the cascade for causing same to be switched into the second state thereof, an impedance means serially coupled in common to the output circuit of each of said switching circuits for receiving the output current therefrom, switching means connected to be responsive to the first occurring in time of said pulse pairs for applying an electrical signal in parallel with said impedance means for switching the one switching circuit not in the first state into said first state, a voltage divider circuit connected for cooperating with said impedance means for applying a bias signal between the control and output circuits of said first switching circuit for switching same into the second state thereof in response to the first conductive state of each of the other switching circuits, and a transistor switching circuit for each switching circuit including a control circuit connected to the output circuit of the corresponding switching circuit and a power circuit connected together in common and coupled to said source of pulses, said transistor switching circuits being responsive to the second occurring in time of said pulse pairs to generate a signal across the power circuits thereof corresponding to the conductive switching circuit.

6. A counting unit for generating a controllable output signal, the combination of which comprises a source of pulse pairs said pulse pairs being of oppositely changing potential about a voltage level, a counting circuit connected to be responsive to the first occurring in time of said pulse pairs for counting from one to the next of a plurality of states of operation and having a plurality of output circuits for generating a coded output signal corresponding to each state thereof, and a transistor switching circuit for each output circuit of said counting circuit including a control circuit connected to the corresponding output circuit of the counting circuit and a power circuit connected together in common and coupled to said source of pulses, said transistor switching circuits being connected to be responsive to the second occurring in time of said pulse pairs to generate a signal across the power circuits thereof corresponding to the coded output signals of said counting circuit.

References Cited in the file of this patent

UNITED STATES PATENTS 3,100,850 McMillian et al. -------- Aug. 13, 1963